United States Patent [19]

Sanjurjo

[11] Patent Number: 4,582,560

[45] Date of Patent: Apr. 15, 1986

[54] IN SITU PRODUCTION OF SILICON CRYSTALS ON SUBSTRATE FOR USE IN SOLAR CELL CONSTRUCTION

[75] Inventor: Angel Sanjurjo, San Jose, Calif.

[73] Assignee: SRI International, Menlo Park, Calif.

[21] Appl. No.: 446,988

[22] Filed: Dec. 6, 1982

[51] Int. Cl.[4] ............................................. C30B 25/10
[52] U.S. Cl. ....................................... 156/613; 427/86
[58] Field of Search ...................... 156/613, DIG. 64; 427/86; 136/261

[56] References Cited

U.S. PATENT DOCUMENTS

| | | | |
|---|---|---|---|
| 3,473,974 | 10/1969 | Faust, Jr. et al. | 156/610 X |
| 4,050,905 | 9/1977 | Swinehart | 23/301 |
| 4,068,020 | 1/1978 | Reuschel | 427/85 |
| 4,129,463 | 12/1978 | Cleland et al. | 148/1.5 |
| 4,301,323 | 11/1981 | Schink | 156/DIG. 64 |

FOREIGN PATENT DOCUMENTS 0001525  1/1981  Japan ........................ 156/DIG. 64

Primary Examiner—Hiram H. Bernstein

[57] ABSTRACT

An improved method is disclosed for growing directly on a substrate, crystals of silicon large enough to permit construction of an efficient solar cell therefrom.

The silicon is transported to a deposition zone together with a growth modifier selected from the class consisting of a Group IV metal, a Group IB metal, the halide of a Group IV metal, the halide of a Group IB metal, or a mixture thereof. The silicon may be in the form of a metal vapor, a silane, or one or more halosilanes.

8 Claims, 3 Drawing Figures

200 μm

111 μm

//4,582,560

IN SITU PRODUCTION OF SILICON CRYSTALS ON SUBSTRATE FOR USE IN SOLAR CELL CONSTRUCTION

BACKGROUND OF THE INVENTION

This invention relates to the production of silicon. More particularly, this invention relates to the in situ growth of large silicon crystals on a substrate suitable for use in the manufacture of solar cells.

The production of solar cells using silicon has lead to much investigation into more economical methods of preparing the crystalline silicon used in the cell.

Conventionally, single crystal boules of semiconductor grade silicon are grown, sliced into wafers, polished, and then mounted on substrates prior to doping and subsequent processing to form a solar cell.

The costs of crystal growing, slicing, polishing, and mounting have resulted in experimentation with methods for forming the crystals directly on the substrate including chemical vapor deposition (CVD) of silicon on a substrate. While such CVD deposition does result in the formation of silicon crystals having the requisite purity, the size of the crystals has typically been below 10 microns. Such techniques have, therefore, not been adopted for production of solar cells because the efficiency of the cell is related to the size of the silicon grains or crystals. A minimum crystal size deemed acceptable for production of an efficient solar cell has been determined to be about 100 microns.

Attempts have been made to alter the size of the deposited silicon crystals resulting from CVD grown polycrystalline silicon. M. W. M. Graef, L. J. Giling, and J. Bloem published a paper entitled "Chemical Vapor Deposition of Silicon On A Liquid Tin Layer" in the Proceedings of the photovoltaic Energy Conference, Luxembourg, 1977, in which they described the effect of chemical vapor deposition (CVD) of silicon by pyrolysis of silane or trichlorosilane in a hydrogen atmosphere onto a substrate covered with a liquid tin film. The authors described the growth of silicon crystals having grain sizes over 100 microns by this method. In a later paper by the same authors and H. H. C. De Moor entitled "The Growth of Polycrystalline Silicon Layers on Top of a Tin-Coated Substrate: In Situ Observations", published in the Proceedings of the 2nd Photovoltaic Solar Energy Conference, Berlin, 1979, it was further noted that the liquid tin substrate could be provided by vacuum deposition of tin on a graphite substrate or by the reduction of SnCl. The authors stated that the surface tension was subsequently reduced by the injection of three pulses of trichlorosilane to form a continuous liquid layer. The deposition of silicon on the liquid tin surface was said to be accomplished by the continuous addition of 0.75% SiHCl and 1% HCl in H causing the growth of needle- and plate-like shaped silicon islands. This method was further described in an article by W. J. P. van Enckevort and M. W. M. Graef entitled "Growth Mechanisms of Silicon Crystallites Grown on Top of a Metal-Coated Graphite Substrate", published in Volume 128 of the Journal of the Electrochemical Society: Solid State Science and Technology in January, 1981. In this later article the HCl is described as causing the evaporation of the liquid tin substrate by the etching activity of the HCl.

While the foregoing articles describe a method which apparently results in the in situ production of silicon crystals of a satisfactory size for solar cell use, the added step of preparing a molten metal coating on a substrate somewhat precludes consideration of the approach from an economical standpoint.

There, therefore, remains a need for a method for the in situ production on a substrate of silicon crystals sufficiently large to be useful in the production of a solar cell therefrom.

SUMMARY OF THE INVENTION

It is, therefore, an object of the invention to provide silicon crystals useful in the production of solar cells.

It is another object of the invention to provide for the in situ formation on a substrate of silicon crystals useful in the production of solar cells.

It is yet another object of the invention to provide in situ formation on a substrate by chemical vapor deposition of silicon crystals useful for production of solar cells.

It is a further object of the invention to provide for the chemical vapor deposition on a substrate of silicon crystals sufficiently large to permit the construction of an efficient solar cell.

It is yet a further object of the invention to provide a method for producing silicon crystals sufficiently large to permit the construction of efficient solar cells therefrom by chemical vapor deposition of silicon directly on a substrate without prior coating steps.

These and other objects of the invention will become apparent from the flow sheet and accompanying description.

In accordance with the invention, silicon crystals are produced on a substrate by chemical vapor deposition comprising the heating of a silicon-bearing compound and a growth modifier selected from the class consisting of one or more metals, one or more metal halides, or a mixture thereof to form a gaseous mixture in a first zone and the subsequent deposition of metallic silicon and a metallic phase of said metal halide in a second zone.

DESCRIPTION OF THE INVENTION

Figure 1:
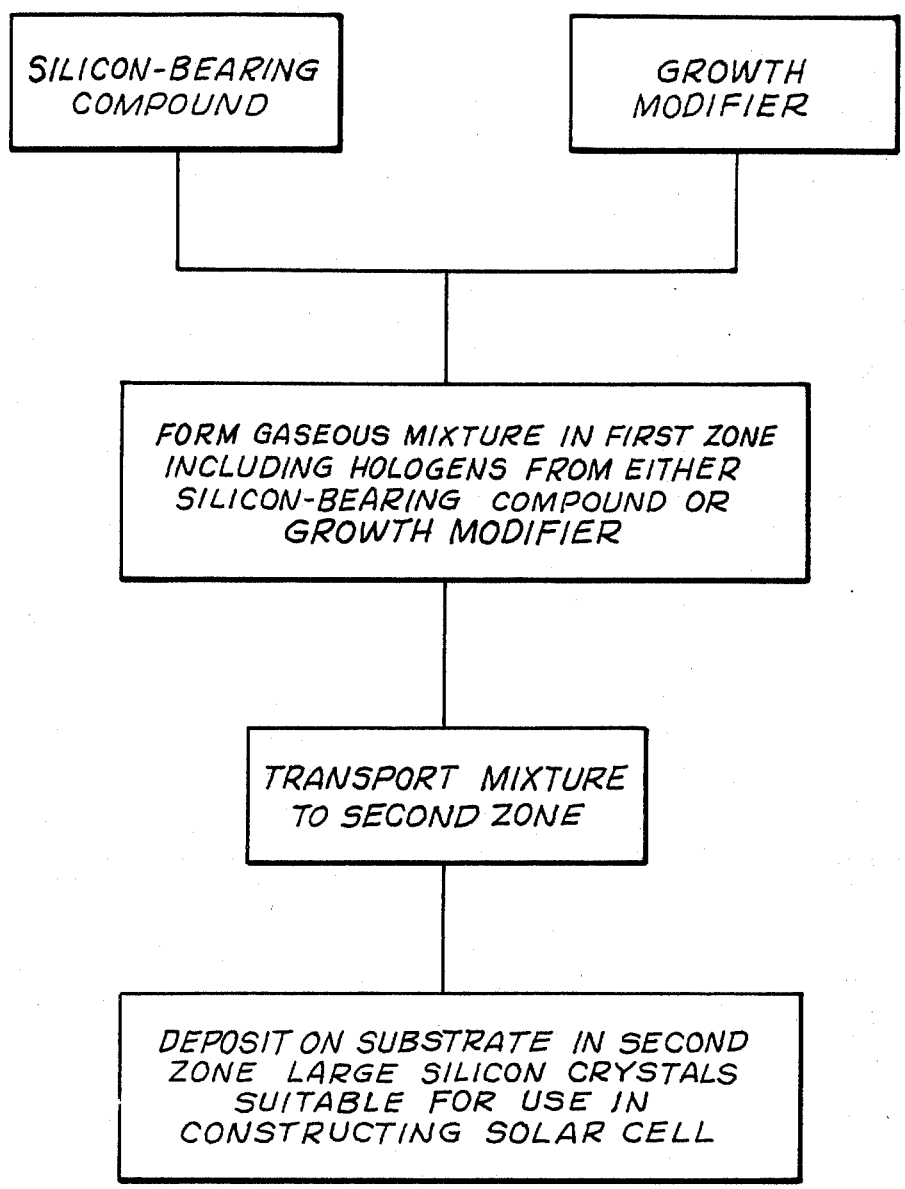
FIG. 1 is a flow sheet illustrating the process of the invention.

In the practice of the invention as generally illustrated in the flow sheet of FIG. 1, a mixture of a silicon bearing compound and a growth modifier are formed into a gaseous mixture in a first zone. The growth modifier is selected from the group consisting of one or more metals, one or more metal halides, or a mixture of the metals and halides where the metallic portion is a Group IVA metal, such as lead or tin, or a Group IB metal, such as copper.

The mixture may be introduced directly as gases or may be formed by heating solid or liquid components sufficiently to vaporize the materials. For example, the silicon may be introduced as a silane or as one or more of the halosilanes gases, or metallic silicon may be heated and chemically vaporized in the first zone. Similarly, the growth modifier such as lead or tin may be directly vaporized or may be introduced as a metal halide that, upon reacting with silicon, will produce silicon halides and the corresponding metal.

In one embodiment the silicon is present as a silane or halosilane gas which is bubbled through a molten bath of lead or tin in the first zone thus permitting the formation of a mixture saturated with the metal vapors of the growth modifier at the operating temperature and pressure.

It should be noted that a reducing gas, such as hydrogen, or an inert gas, such as helium, neon, or argon, can be used as a carrier gas for the growth modifier whether the growth modifier is introduced as a metal vapor or as a metal halide. If such a carrier gas is used with the metal vapors of the growth modifier (or if the silicon is introduced as a subhalide gas), the first zone may be as low as room temperature.

In accordance with another embodiment of the invention the silicon and metal or metal halide growth modifier are heated in the first zone to a temperature above the melting point of the metal or metal halide to as high as a plasma temperature, i.e. to a temperature of 10,000° C., and preferably to a temperature of between 1300°–1500° C. to form a vapor consisting of the growth modifier and a mixture of silicon tetrahalide and subhalides of (by subhalides is meant mono-, di-, and tri-halides of silicon). The vapors are then carried to a cooler zone maintained at a temperature of about 700°–1100° C., preferably below 1000° C.

In this second zone is placed one or more substrates for the deposition of silicon thereon. At the temperature maintained in the second zone the mixture of silicon halides disproportions back to silicon tetrahalide (which may be recycled back to the first, hotter, zone) and silicon which is deposited on the substrate.

While the function of the growth modifier, such as lead or zinc, is not completely understood, and I do not wish to be bound by any particular theory or explanation, the deposition of at least a portion of the vapors of the growth modifier in the cooler zone apparently aids in the growth of large crystals of silicon. This may be due to a masking or covering up of growth sites on the substrate by the deposited metal vapors of the growth modifier. In addition, the presence of the growth modifier on the surface of the substrate in a vaporeous or liquid form may provide a "moving" substrate thereby permitting migration of silicon atoms through such a surface to the silicon already deposited on the substrate thereby promoting single crystal growth wherein a solid-liquid interface is maintained.

It should be noted further that only a trace amount, up to about 1% by weight of the entire mixture of silicon and metal or metal halide growth modifier, need consist of the growth modifier. In fact, the use of larger amounts may not only be wasteful but may pose a disposal or removal problem in the deposition zone where the substrates are located onto which the silicon crystals are to be grown.

To further illustrate the invention, a powder mixture of silicon metal and lead fluoride were induction heated in a first zone to a temperature of 1300° C. in a quartz tube which had been sealed under vacuum at room temperature. A second portion of the quartz tube, which was maintained at a temperature of about 1050° C., contained a graphite substrate onto which the silicon deposited. After 24 hours the tube was broken open, and the lead fluoride was allowed to escape. The deposit in the second, crystallization, zone was observed by Scanning Electron Microscopy. The average crystal size of silicon crystals was 50–100 microns depending upon the area with crystals as large as 300 microns observed. X-ray energy spectrographic (XES) analyses indicated that silicon was the only element present in the crystals.

Figure 2:
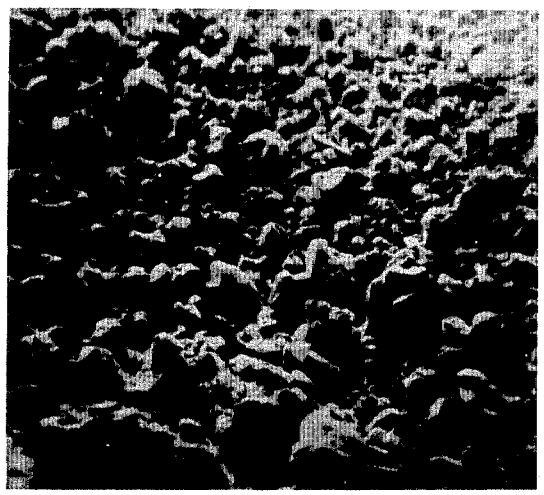
FIG. 2 is a photomicrograph of the silicon crystals produced by the process.
Figure 3:
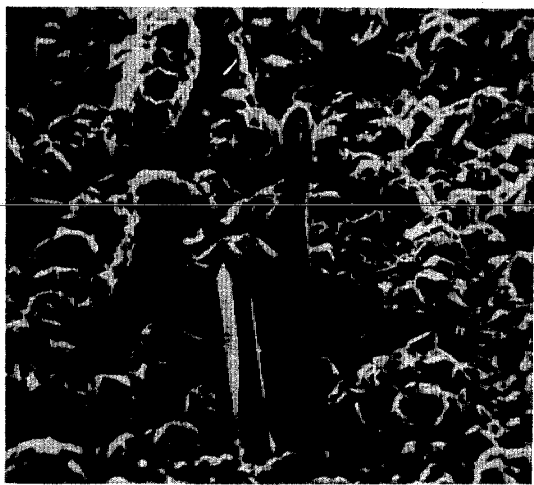
FIG. 3 is another photomicrograph of the silicon crystals produced by the process.

The photomicrographs in FIGS. 2 and 3 illustrate the size of the resulting silicon crystals.

Thus the invention provides an improved system for direct growth on a substrate of crystals suitable for use in the construction of a solar cell.

Having thus described the invention, what is claimed is:

1. A method for increasing the size of silicon crystals to permit economic construction of solar cells therefrom which comprises:
   (a) heating a silicon-bearing material and a growth modifier selected from the group consisting of one or more Group IVA metals, the halide of one or more Group IB metals, and the halide of one or more Group IVA metals in a first zone to a temperature of from at least 1300° C. to as high as a plasma temperature to form a vapor consisting of the growth modifier and said silicon-bearing material; and
   (b) transporting said mixture to a second cooler zone maintained at a temperature of about 700° to 1100° C. to permit deposition on a substrate therein of silicon crystals having an average particle size of from 50 to 300 microns.

2. The method of claim 1 wherein said silicon-bearing material is metallic silicon.

3. The method of claim 1 wherein said silicon-bearing material consists of one or more silicon halides.

4. The method of claim 1 wherein said silicon-bearing material is selected from the group consisting of silane, dichlorosilane, trichlorosilane, tetrachlorosilane, and mixtures thereof.

5. A method for increasing the size of silicon crystals to permit economic construction of solar cells therefrom which comprises:
   (a) heating a silicon-bearing material and a growth modifier comprising the halide of a Group IB metal in a first zone to a temperature of from at least 1300° C. to as high as a plasma temperature to form a vapor consisting of the growth modifier and said silicon-bearing material; and
   (b) transporting said mixture to a second cooler zone maintained at a temperature of about 700° to 1100° C. to permit deposition on a substrate therein of silicon crystals having an average particle size of from 50 to 300 microns and suitable for the construction of a solar cell therefrom.

6. A method for increasing the size of silicon crystals to permit economic construction of solar cells therefrom which comprises:
   (a) heating a silicon-bearing material and a growth modifier selected from the group consisting of one or more Group IVA metals in a first zone to a temperature of from at least 1300° C. to as high as a plasma temperature to form a vapor consisting of the growth modifier and said silicon-bearing material; and
   (b) transporting said mixture to a second cooler zone maintained at a temperature of about 700° to 1100° C. to permit deposition on a substrate therein of silicon crystals having an average particle size of from 50 to 300 microns.

7. A method for increasing the size of silicon crystals to permit economic construction of solar cells therefrom which comprises:

(a) heating a silicon-bearing material and a growth modifier selected from the group consisting of the halide of one or more Group IVA metals in a first zone to a temperature of from at least 1300° C. to as high as a plasma temperature to form a vapor consisting of the growth modifier and said silicon-bearing material; and (b) transporting said mixture to a second cooler zone maintained at a temperature of about 700° to 1100° C. to permit deposition on a substrate therein of silicon crystals having an average particle size of from 50 to 300 microns.

8. A method for increasing the size of silicon crystals to permit economic construction of solar cells therefrom which comprises:

(a) injecting a mixture of a silicon-bearing material and a growth modifier selected from the group consisting of one or more Group IVA metals and the halide of one or more Group IVA metals into a first zone at a temperature above the melting point of the silicon-bearing material and the growth modifier; and (b) transporting said mixture to a second cooler zone maintained at a temperature of about 700° to 1100° C. to permit deposition on a substrate therein of silicon crystals having an average particle size of from 50 to 300 microns.

* * * * *